(12) United States Patent
Carroll (10) Patent No.: US 11,101,439 B2
(45) Date of Patent: Aug. 24, 2021

(54) THIN-FILM PN JUNCTIONS AND APPLICATIONS THEREOF

(71) Applicant: Wake Forest University, Winston-Salem, NC (US)

(72) Inventor: David Carroll, Winston-Salem, NC (US)

(73) Assignee: Wake Forest University, Winston-Salem, NC (US)

(*) Notice: Subject to any disclaimer, the term of this patent is extended or adjusted under 35 U.S.C. 154(b) by 0 days.

(21) Appl. No.: 15/578,041

(22) PCT Filed: May 27, 2016

(86) PCT No.: PCT/US2016/034722
§ 371 (c)(1),
(2) Date: Nov. 29, 2017

(87) PCT Pub. No.: WO2016/196318
PCT Pub. Date: Dec. 8, 2016

(65) Prior Publication Data
US 2018/0175312 A1    Jun. 21, 2018

Related U.S. Application Data

(60) Provisional application No. 62/168,426, filed on May 29, 2015.

(51) Int. Cl.
*H01L 51/05* (2006.01)
*H01L 25/11* (2006.01)
(Continued)

(52) U.S. Cl.
CPC ........ *H01L 51/0587* (2013.01); *H01L 25/115* (2013.01); *H01L 29/0665* (2013.01);
(Continued)

(58) Field of Classification Search
CPC .............. H01L 51/0587; H01L 25/115; H01L 29/0665; H01L 29/24; H01L 29/242;
(Continued)

(56) References Cited

U.S. PATENT DOCUMENTS

2005/0045874 A1* 3/2005 Xiao ................... H01L 51/0575
257/40
2008/0173537 A1* 7/2008 DeSteese ................ H01L 35/08
204/192.25
(Continued)

FOREIGN PATENT DOCUMENTS

| CN | 103 682 099 A | 3/2014 |
| GB | 2 419 739 A | 5/2006 |
| WO | 2004/112151 A2 | 12/2004 |

OTHER PUBLICATIONS

International Search Report and Written Opinion issued in corresponding International Application No. PCT/US2016/034722 dated Oct. 7, 2016.

*Primary Examiner* — Shahed Ahmed
(74) *Attorney, Agent, or Firm* — Patent Grove LLC; Tomas Friend (57) ABSTRACT

In one aspect, composite materials including a thin-film layer of lateral p-n junctions are described herein, which can be employed in circuits or various components of electrical devices. Briefly, a composite material comprises a thin-film layer including p-type regions alternating with n-type regions along a face of the thin-film layer, the p-type regions comprising electrically conductive particles dispersed in a first organic carrier and the n-type regions comprising electrically conductive particles dispersed in a second organic carrier, wherein p-n junctions are established at interfaces between the p-type and n-type regions. As described further herein, the thin-film layer is flexible, permitting the thin-film (Continued)

to be folded or arranged into a number of configurations to provide various circuits or components of electrical devices.

25 Claims, 11 Drawing Sheets

(51) Int. Cl.
*H01L 29/861* (2006.01)
*H01L 29/24* (2006.01)
*H01L 29/06* (2006.01)
*B82Y 30/00* (2011.01)
*H01L 27/28* (2006.01)

(52) U.S. Cl.
CPC ............ *H01L 29/24* (2013.01); *H01L 29/242* (2013.01); *H01L 29/861* (2013.01); *B82Y 30/00* (2013.01); *H01L 27/286* (2013.01)

(58) Field of Classification Search
CPC ..... H01L 29/861; H01L 27/286; H01L 31/02; H01L 33/0008; H01L 33/0016; H01L 33/0012; B82Y 30/00
See application file for complete search history.

(56) References Cited

U.S. PATENT DOCUMENTS

| | | | |
|---|---|---|---|
| 2013/0298984 A1* | 11/2013 | Kherani | ............ H01L 31/02167 136/256 |
| 2015/0318360 A1* | 11/2015 | Lu | ....................... H01L 21/8258 257/192 |
| 2016/0270544 A1* | 9/2016 | DeFranks | ............ A47C 21/048 |
| 2017/0092436 A1* | 3/2017 | Miura | ..................... H01G 9/20 |

* cited by examiner

THIN-FILM PN JUNCTIONS AND APPLICATIONS THEREOF

RELATED APPLICATION DATA

This application is a U.S. National Phase of PCT/US2016/034722, filed May 27, 2016, which claims priority pursuant to 35 U.S.C. § 119(e) to U.S. Patent Application No. 62/168,426, filed on May 29, 2015, the entirety of each are hereby incorporated by reference in their entireties.

FIELD

The present invention relates to semiconductor architectures and, in particular, to flexible thin-film structures employing p-type regions and n-type regions arranged in a lateral alternating format.

BACKGROUND

P-N junctions play critical roles in a variety of electronic devices and associated electrical circuits. For many applications, p-n junctions are fabricated as crystalline materials grown by gas phase deposition of elements selected from Groups IIB-VIA of the Periodic Table. Various combinations of elements can be selected for p-n junction fabrication depending on desired electronic properties of the junction. Moreover, various deposition techniques are available including chemical vapor deposition (CVD), physical vapor deposition (PVD), molecular beam epitaxy (MBE) and atomic layer deposition (ALD). Such deposition techniques require expensive equipment, corrosive gases and suffer from a limited selection of suitable deposition substrates and long deposition times. Further, the deposited crystalline phases are generally inflexible, thereby precluding application to environments of complex geometry. In view of these deficiencies, new p-n junction architectures are called for.

SUMMARY

In one aspect, composite materials including a thin-film layer of lateral p-n junctions are described herein, which can be employed in circuits or various components of electrical devices. Briefly, a composite material comprises a thin-film layer having a plurality of lateral p-n junctions across a face of the thin-film layer, the lateral p-n junctions established at interfaces between p-type regions and n-type regions, the p-type regions comprising electrically conductive particles dispersed in a first organic carrier and the n-type regions comprising electrically conductive particles dispersed in a second organic carrier. As described further herein, the thin-film layer is flexible, permitting the thin-film to be folded, bent or arranged into a number of configurations to provide various circuits or components of electrical devices.

In another aspect, methods of making composite materials are described herein. A method of making a composite material comprises laterally joining a plurality of p-type segments and n-type segments across a face of a single-layer thin film, the p-type segments comprising electrically conductive particles dispersed in a first organic carrier and the n-type segments comprising electrically conductive particles dispersed in a second organic carrier, wherein p-n junctions are established at interfaces between the p-type and n-type segments. As described further herein, seams can be evident at interfaces of the p-type and n-type segments. Alternatively, interfaces of the p-type and n-type segments can be seamless.

In another aspect, electrical circuits are described herein. For example, an electrical circuit comprises a thin-film layer having a plurality of lateral p-n junctions across a face of the thin-film layer, the lateral p-n junctions established at interfaces between p-type regions and n-type regions, the p-type regions comprising electrically conductive particles dispersed in a first organic carrier and the n-type regions comprising electrically conductive particles dispersed in a second organic carrier. The thin-film layer exhibits a folded configuration with electrical leads attached to the thin-film layer at a plurality of locations. Depending on folded orientation and locations of electrical lead attachment, the thin-film layer can be employed in circuits of various functionalities.

In a further aspect, methods of fabricating electrical circuits or components of electrical devices are described herein. For example, a method comprises providing a thin-film layer having a plurality of lateral p-n junctions across the face of the thin-film layer, the lateral p-n junctions established at interfaces between p-type regions and n-type regions, the p-type regions comprising electrically conductive particles dispersed in a first organic carrier and the n-type regions comprising electrically conductive particles dispersed in a second organic carrier. The thin film layer is folded and electrical leads attached to the thin film for current input and current output. In some embodiments, the thin film layer is folded along the p-n junctions to provide a corrugated orientation to the layer. Alternatively, the thin film can be bent or wrapped around a substrate and the electrical leads attached for current input and current output.

These and other embodiments are described further in the following detailed description.

DETAILED DESCRIPTION

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present invention. Numerous modifications and adaptations will be readily apparent to those of skill in the art without departing from the spirit and scope of the invention.

I. Thin-Film Layers

Figure 1:
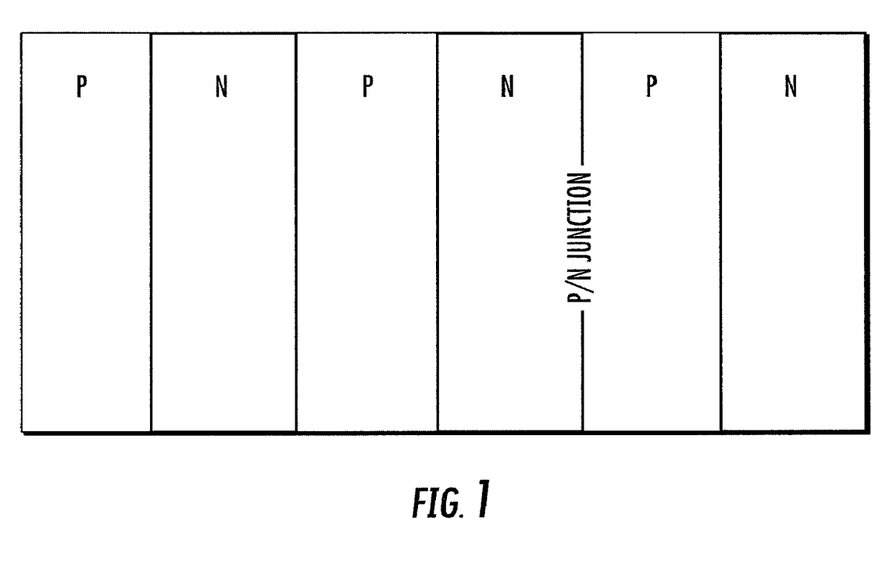
FIG. 1 is a schematic of a face of a thin-film layer according to one embodiment described herein with p-type regions and n-type regions laterally arranged in an alternating format establishing a plurality of p-n junctions.

In one aspect, composite materials including a thin-film layer of lateral p-n junctions are described herein which can be employed in circuits or various components of electrical devices. A composite material comprises a thin-film layer having a plurality of lateral p-n junctions across the face of the thin-film layer, the lateral p-n junctions established at interfaces between p-type regions and n-type regions, the p-type regions comprising electrically conductive particles dispersed in a first organic carrier and the n-type regions comprising electrically conductive particles dispersed in a second organic carrier. FIG. 1 is a schematic of a thin-film layer described herein with p-type regions and n-type regions laterally arranged in an alternating format establishing a plurality of p-n junctions along a face of the thin-film layer. In being laterally arranged, the p-type regions, n-type regions and associated p-n junctions are not arranged or stacked in the vertical or axial dimension. Alternatively, the p-type regions and n-type regions are not required to be arranged in an alternating format. In some embodiments, for example, individual p-n junctions are spaced apart from one another across the face of the thin-film layer. As described further herein, the lateral p-n junctions can have placement or arrangement on the thin-film face commensurate with functionality of an electrical circuit formed from the thin-film in a folded orientation.

Turning now to specific components, a thin-film layer comprises a plurality of p-type regions comprising electrically conductive particles dispersed in a first organic carrier. Electrically conductive particles of the p-type regions can include p-type organic nanoparticles, p-type inorganic nanoparticles or mixtures thereof. In some embodiments, p-type nanoparticles are selected from the group consisting of nanotubes, nanowires, nanorods, platelets and sheets. The p-type nanoparticles can have a 1-dimensional or 2-dimensional structure, in some embodiments.

P-type organic nanoparticles can include carbon nanotubes, fullerenes, graphene or mixtures thereof. In some embodiments, lattice structures of the organic p-type nanoparticles include one or more dopants such as boron. Alternatively, p-type dopant is externally applied to the organic nanoparticles by the environment surrounding the nanoparticles in the first organic carrier. For example, the first organic carrier can provide p-dopant to surfaces of the organic nanoparticles. Similarly, one or more p-dopant species can be dispersed in the first organic carrier for interaction with the organic nanoparticles.

P-type inorganic nanoparticles can include binary, ternary and quaternary semiconductor compositions formed from elements selected from Groups IB, IIB and IIIA-VIA of the Periodic Table. For example, p-type inorganic nanoparticles can be formed of $Cu_{2-x}Te$, $Cu_{2-x}Se$, $Sb_2Te_3$, $Ag_2Se$, $Ag_2Te$, $Cu_2Te$, $Cu_2Se$, Se or Te. P-type inorganic nanoparticles can also be selected from various transition metal dichalcogenides, $MX_2$, where M is a transition metal and X is a chalcogen. Table I provides non-limiting examples of p-type inorganic nanoparticles and morphology.

TABLE I

| P-type Inorganic Nanoparticles | |
| --- | --- |
| Nanoparticle Composition | Morphology |
| $Cu_{2-x}Te$ | Nanowires |
| $Cu_{2-x}Se$ | Nanowires |
| $Sb_2Te_3$ | Nanoplatelets |
| Te | Nanorods |
| $Ag_2Se$ | 1D Nanowire |
| $Ag_2Te$ | 1D Nanowire |
| $Cu_2Te$ | 1D Nanowire |
| $Cu_2Se$ | 1D Nanowire |
| Se | 1D Nanowire |
| Te | 1D Nanowire |

In some embodiments, p-dopant is externally applied to inorganic nanoparticles by the first organic carrier and/or one or more p-dopant species dispersed in the second organic carrier. For example, the inorganic nanoparticles can be sufficiently thin that electronic properties of the nanoparticles are dominated by surface behavior and surface interactions. The inorganic nanoparticles can lack sufficient thickness to exhibit any meaningful bulk properties. Therefore, p-dopant species externally applied to the inorganic nanoparticles can create the p-type character of the nanoparticles. In some embodiments, the inorganic nanoparticles of the p-type region are one or more topological insulators.

P-type organic nanoparticles and/or inorganic nanoparticles can be present in the first organic carrier in any amount not inconsistent with the objectives of the present invention. In some embodiments, p-type organic and/or inorganic nanoparticles are present in the first organic carrier in an amount of 0.1 weight percent to 30 weight percent. In some alternative embodiments, a layer of the p-type nanoparticles is formed over the first organic carrier. In such embodiments, the first organic carrier serves as a support for the nanoparticle layer as opposed to a matrix in which the organic and/or inorganic nanoparticles are dispersed.

The first organic carrier can comprise any material operable to host or support p-type organic nanoparticles and/or p-type inorganic nanoparticles to provide a thin-film structure having p-type electronic structure. For example, the first organic carrier can comprise one or more polymeric species. Suitable polymeric species can include one or more fluoropolymers. In some embodiments, the first organic carrier comprises polyvinylidene fluoride (PVDF), polyvinyl fluoride (PVF), polyvinylidene fluoride-trifluoroethylene (PVDF-TrFE), polyvinylidene fluoride-tetrafluoroethylene (PVDF-TFE), polytetrafluoroethylene (PTFE), or mixtures or copolymers thereof. Semicrystalline polymers of PVDF, PVDF-TFE and/or PVDF-TrFE used in p-type regions of the thin-film layer can demonstrate increased amounts of β-phase. For example, PVDF, PVDF-TFE and/or PVDF-TrFE of a p-type layer can display a phase ratio of β/α of 1.5 to 2.5. In some embodiments, the β/α phase ratio is 2 to 2.5. β-phase crystallites can be provided a non-random orientation by poling techniques, thereby enhancing piezoelectric and pyroelectric properties of the polymeric matrix.

Alternatively, the first organic carrier can comprise one or more elastomeric species, including polyisoprene, polyisobutylene and polysiloxanes, such as polydimethylsiloxane (PDMS). The first organic carrier can also comprise polyacrylic acid (PAA), polymethacrylate (PMA), polymethylmethacrylate (PMMA) or mixtures or copolymers thereof. Additionally, the first organic carrier can comprise polyolefin including, but not limited to polyethylene, polypropylene, polybutylene or mixtures or copolymers thereof.

Semiconducting polymers can also find application as the first organic carrier. Suitable semiconducting polymers can include phenylene vinylenes, such as poly(phenylene vinylene) and poly(p-phenylene vinylene) (PPV), and derivatives thereof. In some embodiments, semiconducting polymers comprise poly fluorenes, naphthalenes, and derivatives thereof. In other embodiments, semiconducting polymers comprise poly(2-vinylpyridine) (P2VP), polyamides, poly(N-vinylcarbazole) (PVCZ), polypyrrole (PPy), polyaniline (PAn) and poly[2,6-(4,4-bis-(2-ethylhexyl)-4H-cyclopenta[2,1-b;3,4-b']dithiophene)-alt-4,7-(2,1,3-benzothiadiazole)] (PCPDTBT).

Alternatively, in some embodiments, the first organic carrier can be substituted by a first inorganic carrier. Inorganic carriers, in some embodiments, include polycrystalline ceramics or other particulate inorganic materials.

In addition to p-type regions, the thin-film layer comprises a plurality of n-type regions comprising electrically conductive particles dispersed in a second organic carrier. Electrically conductive particles of the n-type regions can include n-type organic nanoparticles, n-type inorganic nanoparticles or mixtures thereof. In some embodiments, n-type nanoparticles are selected from the group consisting of nanotubes, nanowires, nanorods, platelets and sheets. The n-type nanoparticles can have a 1-dimensional or 2-dimensional structure, in some embodiments.

N-type organic nanoparticles can include carbon nanotubes, fullerenes, graphene or mixtures thereof. In some embodiments, lattice structures of the organic n-type nanoparticles include one or more dopants such as nitrogen. Alternatively, n-type dopant is externally applied to the organic nanoparticles by the environment surrounding the nanoparticles in the second organic carrier. For example, the second organic carrier can provide n-dopant to surfaces of the organic nanoparticles. Similarly, one or more n-dopant species can be dispersed in the second organic carrier for interaction with the organic nanoparticles.

N-type inorganic nanoparticles can include binary, ternary and quaternary semiconductors compositions formed from elements selected from Groups IB, IIB and IIIA-VIA of the Periodic Table. For example, n-type inorganic nanoparticles can be formed of $Bi_2Se_3$, $Bi_2Te_3$, $Bi_2Te_{3-x}Se_x$, $Sb_2Te_3$, $Sb_{2-x}Bi_xTe_3$, Cu doped $Bi_2Se_3$ and Ag surface modified $Bi_2Se_3$ and $Bi_2Te_3$. N-type inorganic nanoparticles can also be selected from various transition metal dichalcogenides, $MX_2$. In some embodiments, n-type transition metal dichalcogenides include $TiS_2$, $WS_2$ and $MoS_2$. Table II provides non-limiting examples of n-type inorganic nanoparticles and morphology.

TABLE II

| N-type Inorganic Nanoparticles | |
| --- | --- |
| Nanoparticle Composition | Morphology |
| Cu doped $Bi_2Se_3$ | Platelets |
| $Bi_2Se_3$ | 2D plate |

TABLE II-continued

| N-type Inorganic Nanoparticles | |
| --- | --- |
| Nanoparticle Composition | Morphology |
| $Bi_2Te_3$ | 2D plate |
| $Bi_2Te_{3-x}Se_x$ | 2D plate |
| $Sb_2Te_3$ | 2D plate |
| $Sb_{2-x}Bi_xTe_3$ | 2D plate |
| $TiS_2$ | 2D plate |
| $WS_2$ | 2D plate |
| $MoS_2$ | 2D plate |

Figure 2:
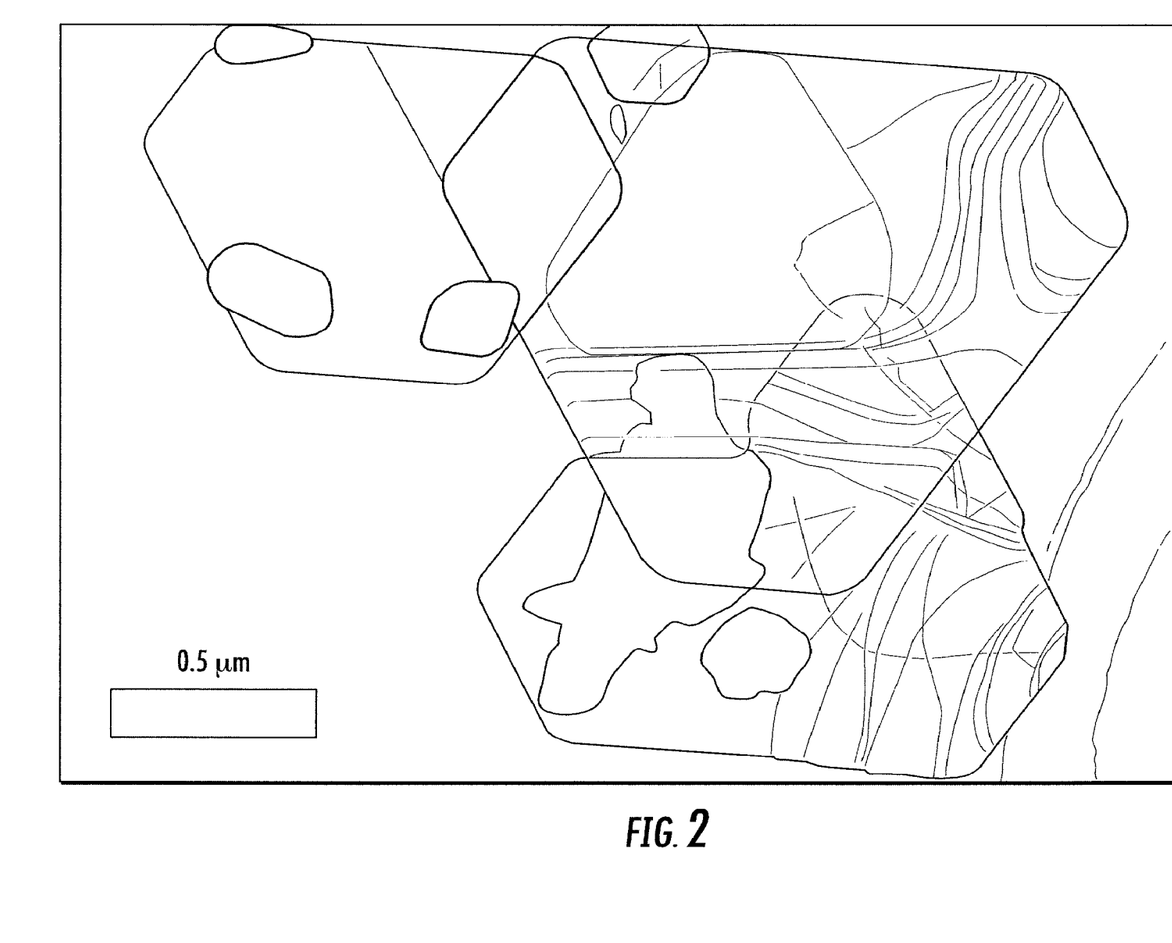
FIG. 2 is a transmission electron microscopy (TEM) image of inorganic nanoplates employed in thin-film architectures according to some embodiments described herein.

In some embodiments, n-dopant is externally applied to inorganic nanoparticles by the second organic carrier and/or one or more n-dopant species dispersed in the first organic carrier. As with the p-type inorganic nanoparticles, the n-type inorganic nanoparticles can lack sufficient thickness to exhibit any meaningful bulk properties. Therefore, n-dopant species externally applied to the inorganic nanoparticles can create the n-type character of the nanoparticles. FIG. 2 is a TEM of bismuth selenide nanoplates according to one embodiment described herein. As illustrated in FIG. 2, the nanoplates are several tens of nanometers thick but have lateral dimensions of several microns. Moreover, the inorganic nanoparticles of the n-type region can be selected from one or more topological insulators.

N-type organic nanoparticles and/or inorganic nanoparticles can be present in the second organic carrier in any amount not inconsistent with the objectives of the present invention. In some embodiments, n-type organic and/or inorganic nanoparticles are present in the second organic carrier in an amount of 0.1 weight percent to 30 weight percent. In some alternative embodiments, a layer of the n-type nanoparticles is formed over the second organic carrier. In such embodiments, the second organic carrier serves as a support for the nanoparticle layer as opposed to a matrix in which the organic and/or inorganic nanoparticles are dispersed.

The second organic carrier can comprise any material operable to host or support n-type organic nanoparticles and/or n-type inorganic nanoparticles to provide a thin-film structure having n-type electronic structure. For example, the second organic carrier can comprise one or more polymeric species. Suitable polymeric species can include one or more fluoropolymers. In some embodiments, the first organic carrier comprises polyvinylidene fluoride (PVDF), polyvinyl fluoride (PVF), polyvinylidene fluoride-trifluoroethylene (PVDF-TrFE), polyvinylidene fluoride-tetrafluoroethylene (PVDF-TFE), polytetrafluoroethylene (PTFE), or mixtures or copolymers thereof. Semicrystalline polymers of PVDF, PVDF-TFE and/or PVDF-TrFE used in n-type regions of the thin-film layer can demonstrate increased amounts of β-phase. For example, PVDF, PVDF-TFE and/or PVDF-TrFE of a p-type layer can display a phase ratio of β/α of 1.5 to 2.5. In some embodiments, the β/α phase ratio is 2 to 2.5.

Alternatively, the first organic carrier can comprise one or more elastomeric species, including polyisoprene, polyisobutylene and polysiloxanes, such as polydimethylsiloxane (PDMS). The first organic carrier can also comprise polyacrylic acid (PAA), polymethacrylate (PMA), polymethylmethacrylate (PMMA) or mixtures or copolymers thereof. Additionally, the first organic carrier can comprise polyolefin including, but not limited to polyethylene, polypropylene, polybutylene or mixtures or copolymers thereof.

Semiconducting polymers can also find application as the second organic carrier. Suitable semiconducting polymers can include phenylene vinylenes, such as poly(phenylene vinylene) and polyp-phenylene vinylene) (PPV), and derivatives thereof. In some embodiments, semiconducting polymers comprise poly fluorenes, naphthalenes, and derivatives thereof. In other embodiments, semiconducting polymers comprise poly(2-vinylpyridine) (P2VP), polyamides, poly(N-vinylcarbazole) (PVCZ), polypyrrole (PPy), polyaniline (PAn) and poly[2,6-(4,4-bis-(2-ethylhexyl)-4H-cyclopenta[2,1-b;3,4-b']dithiophene)-alt-4,7-(2,1,3-benzothiadiazole)] (PCPDTBT).

The second organic carrier, in some embodiments, can be substituted by a second inorganic carrier. Inorganic carriers, in some embodiments, include polycrystalline ceramics or other particulate inorganic materials.

As described herein, p-n junctions are established at interfaces of the p-type and n-type regions. Depending on construction of adjacent p-type and n-type regions, the interfaces can exhibit seams or be seamless. For example, the first organic carrier and second organic carrier can be formed of the same material, thereby providing a seamless interface between the p-type and n-type regions. Alternatively, the first organic carrier and second organic carrier are formed of differing materials providing a seam at the interface.

Figure 3:
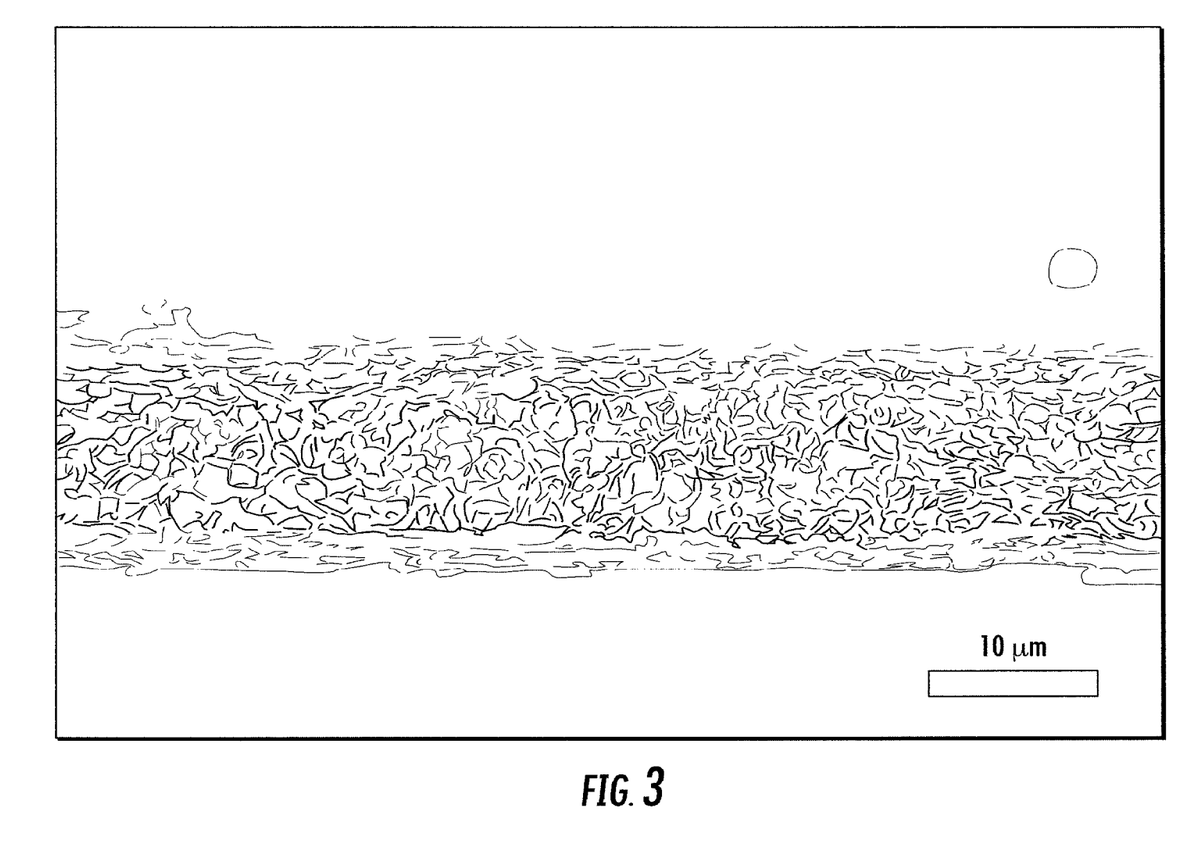
FIG. 3 is an optical microscopy image of a thin-film layer comprising inorganic nanoparticles according to one embodiment described herein.

The thin-film layer can have any desired thickness not inconsistent with the objectives of the present invention. Thickness, for example, can be varied according to deposition methods and conditions and the amount of organic carriers employed. In some embodiments, the thin-film layer has a thickness of 10 nm to 100 μm or 50 nm to 50 μm. FIG. 3 is an optical microscopy image of a thin-film layer formed of $Bi_2Se_3$ nanoparticles according to one embodiment described herein.

Individual p-type regions and n-type regions can be fabricated by dispersing the desired nanoparticles in a liquid phase including the organic carrier and cast into a thin-film segment. The individual p-type segments and n-type segments are laterally joined in fabrication of the single-layer thin film, wherein p-n junctions are established at interfaces between the p-type and n-type segments. In some embodiments, for example, the individual segments are solvent welded, wherein the solvent welding occurs at edges of the segments to maintain a lateral format. In other embodiments, individual segments can be joined by melting or other heat treatment techniques. Melting of the first and second organic carriers, for example, can be localized to interfacial regions between the p-type and n-type segments. In further embodiments, conductive adhesives can be employed to joint p-type and n-type segments.

In an alternative technique, a p-type segment is provided and selectively doped in at least one region to form an n-type segment. In some embodiments, multiple regions of the p-type segment are doped to provide n-type segments alternating with undoped regions of the p-type segment. Similarly, an n-type segment can be provided and selectively doped in at least one region to form a p-type segment. In some embodiments, multiple regions of the n-type segment are doped to provide p-type segments alternating with undoped regions of the n-type segment.

Figure 4:
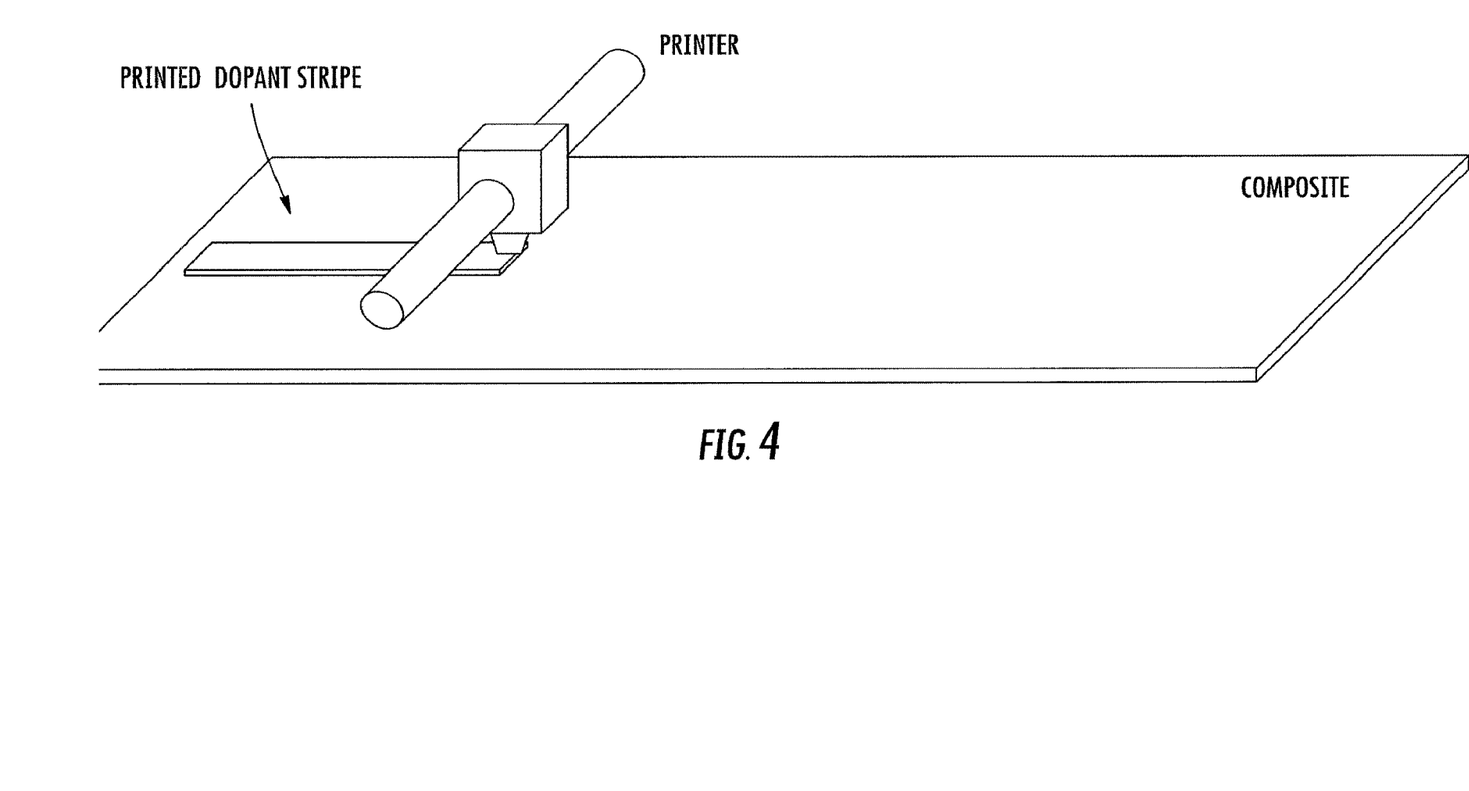
FIG. 4 illustrates printing of a p-type or n-type dopant onto the thin-film comprising inorganic nanoparticles according to one embodiment described herein.

In a further technique, a thin-film is provided comprising inorganic nanoparticles in an organic carrier. The inorganic nanoparticles are sufficiently thin, permitting electronic properties of the nanoparticles to be dominated by surface interactions and/or behaviors. For example, the inorganic nanoparticles can be nanoplates having dimensions described herein. One or more p-type segments are formed by depositing p-dopant onto the thin-film in selected area(s). The p-dopant interacts with the inorganic nanoparticles, thereby providing the doped region p-type electronic structure. Similarly, one or more n-type regions can be formed adjacent to the p-type regions by depositing n-dopant onto the thin-film. The n-dopant interacts with inorganic nanoparticles, thereby providing n-type electronic structure. For example, p-type and n-type dopants can be printed onto the thin-film layer to provide the lateral p-n junction architecture described herein. In such embodiments, the organic carrier of the inorganic nanoparticles prior to doping is the same for the p-type regions and the n-type regions enabling a seamless heterojunction structure. FIG. 4 illustrates printing of a p-type or n-type dopant onto the thin-film comprising inorganic nanoparticles according to one embodiment described herein.

In some embodiments, printing of dopant can permit the formation of various heterojunction architectures. For example, p-insulator-n junctions can be formed by spacing the printing of p-dopant and n-dopant. Moreover, p-metal-n junctions can be formed by providing a region between the p-type and n-type regions with sufficient dopant to render the electronic structure of the region metallic. In further embodiments, the p-type regions can exhibit varying levels of p-dopant, thereby producing dopant gradients. P-dopant gradients, for example, can be present within a single p-type region, such as a p/p−/p−− gradient across the p-type region. Alternatively, a p-dopant gradient can be established between separate p-type regions on the face of the thin film. Similarly, n-type regions can exhibit varying levels of n-dopant, thereby producing dopant gradients. N-dopant gradients can be present within a single n-type region, such as an n/n+/n++ gradient across the n-type region. Additionally, an n-dopant gradient can be established between separate n-type regions on the face of the film.

II. Electrical Circuits and Apparatus

In another aspect, electrical circuits are described herein. For example, an electrical circuit comprises a thin-film layer having a plurality of lateral p-n junctions across a face of the thin-film layer, the lateral p-n junctions established at interfaces between p-type regions and n-type regions, the p-type regions comprising electrically conductive particles dispersed in a first organic carrier and the n-type regions comprising electrically conductive particles dispersed in a second organic carrier. The thin-film layer exhibits a folded or bent configuration with electrical leads attached to the thin-film layer at a plurality of locations. In some embodiments, for example, the thin-film layer is folded into a corrugated orientation.

Depending on folded orientation and locations of electrical lead attachment, the thin-film layer can be employed in circuits of various functionalities including, but not limited to, rectifiers, voltage multipliers, diodes, resistors, capacitors, transistors and inductors.

Figure 5:
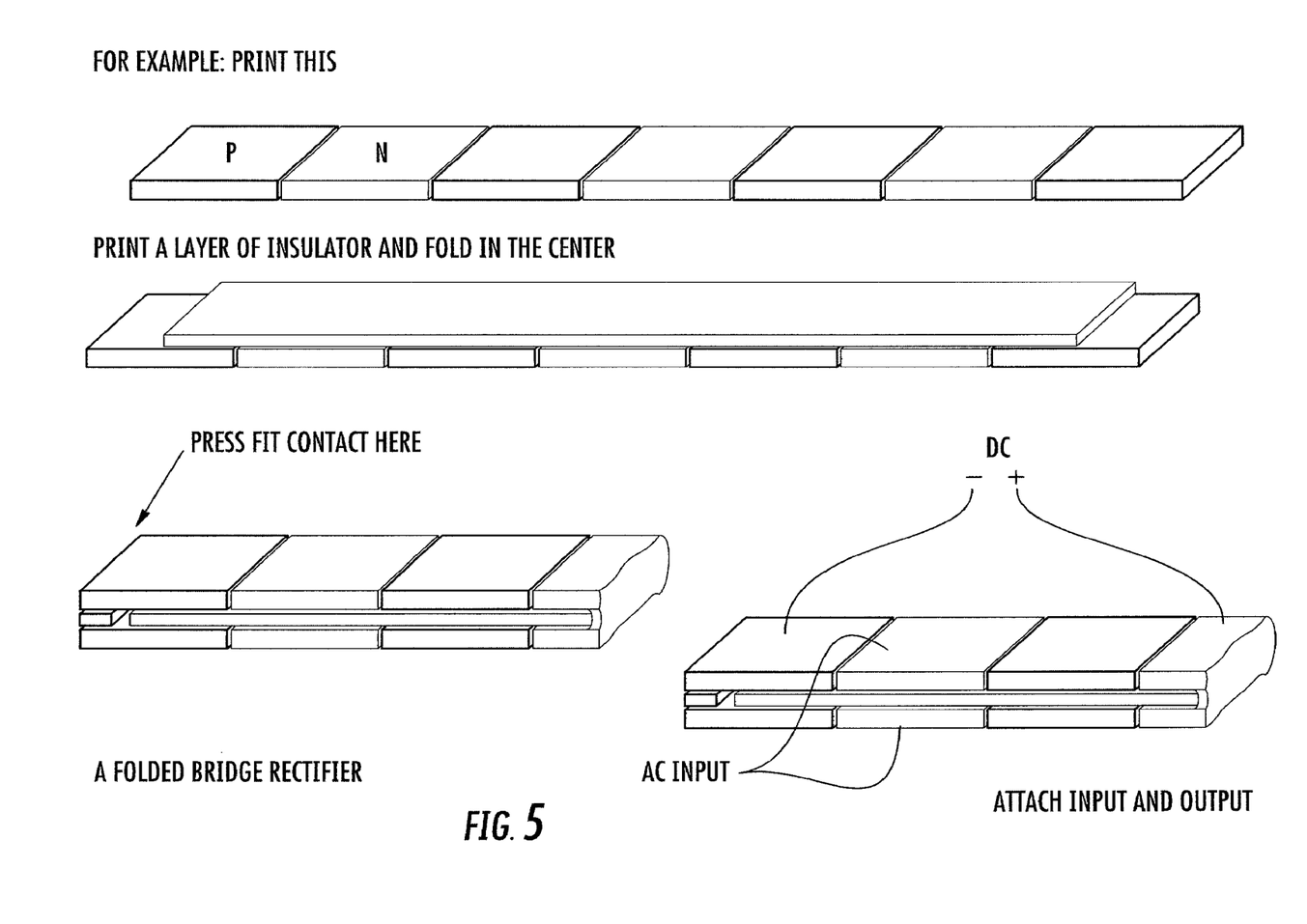
FIG. 5 illustrates one arrangement in which the thin-film layer can be folded and attached to electrical leads to provide a bridge rectifier.

In some embodiments, the thin-film layer described in Section I above is folded to construct a bridge rectifier. FIG. 5 illustrates one arrangement in which the thin-film layer can be folded and attached to electrical leads to provide a bridge rectifier. As illustrated in FIG. 5, an insulating layer is applied to the thin-film layer to electrically isolate opposing faces of the thin-film in the folded orientation.

Figure 6:
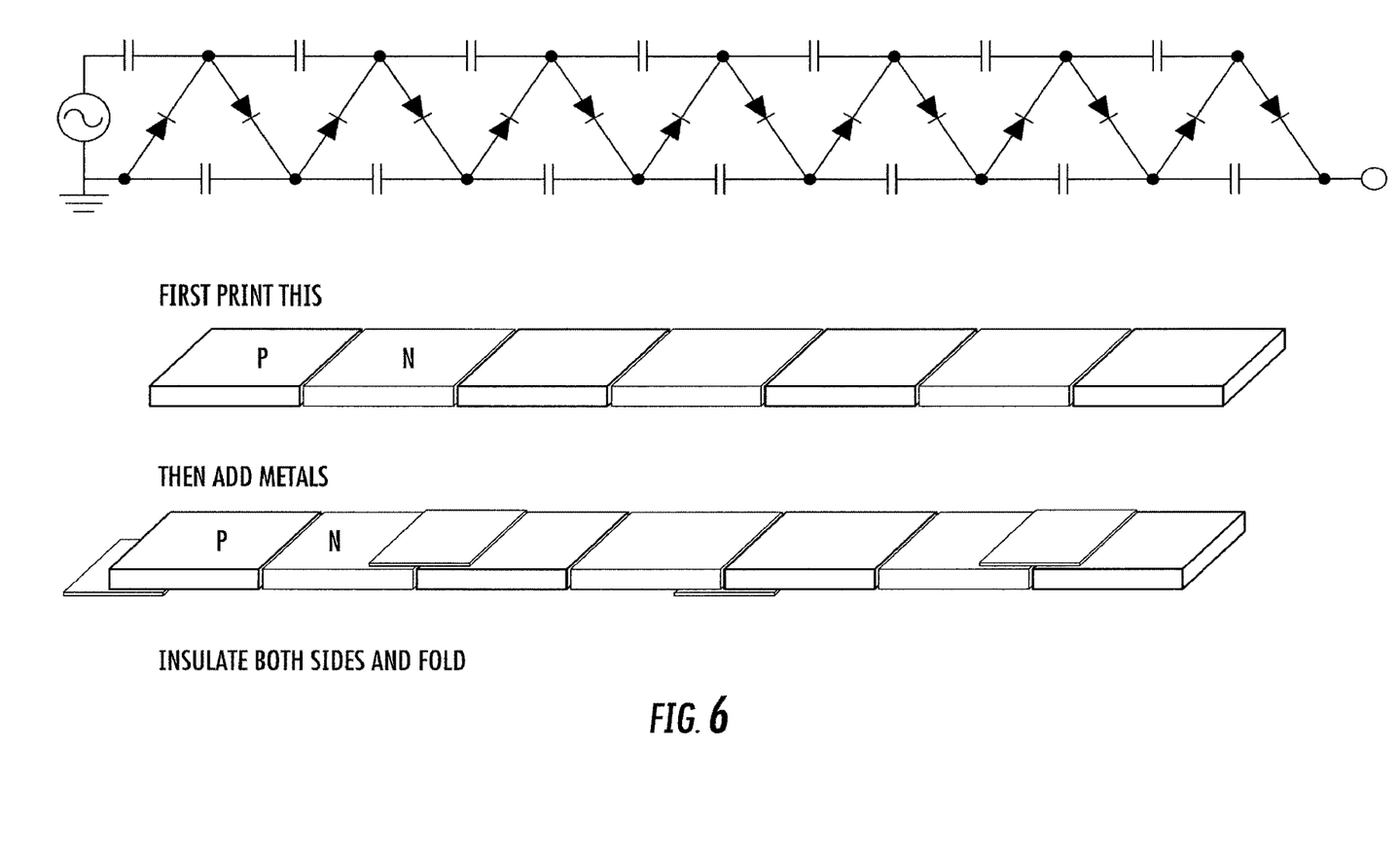
FIG. 6 illustrates preparation of a thin-film for folding into a voltage multiplier according to one embodiment described herein.
Figure 7:
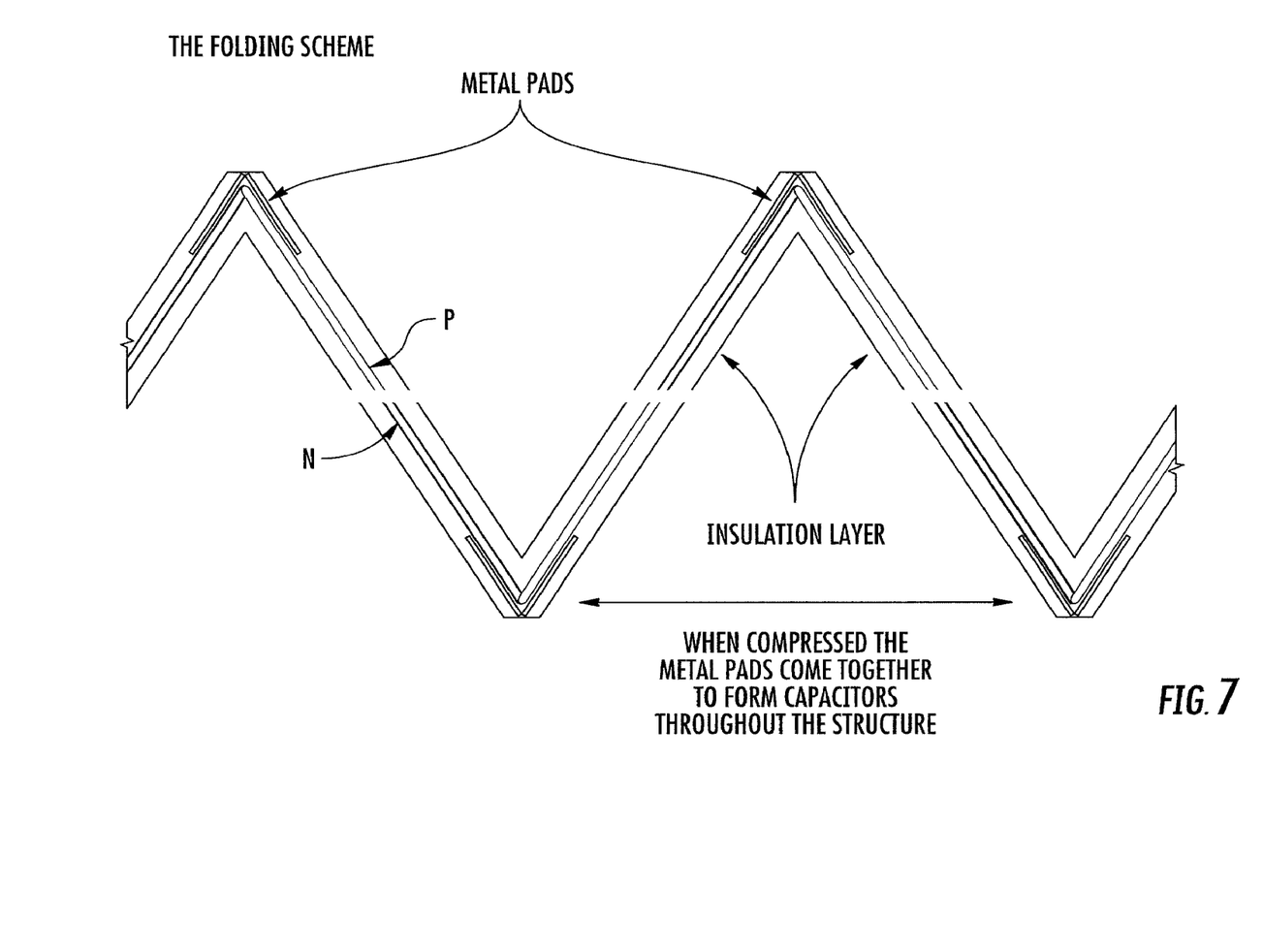
FIG. 7 illustrates folded orientation of the thin-film of FIG. 6 to provide a voltage multiplier.
Figure 8:
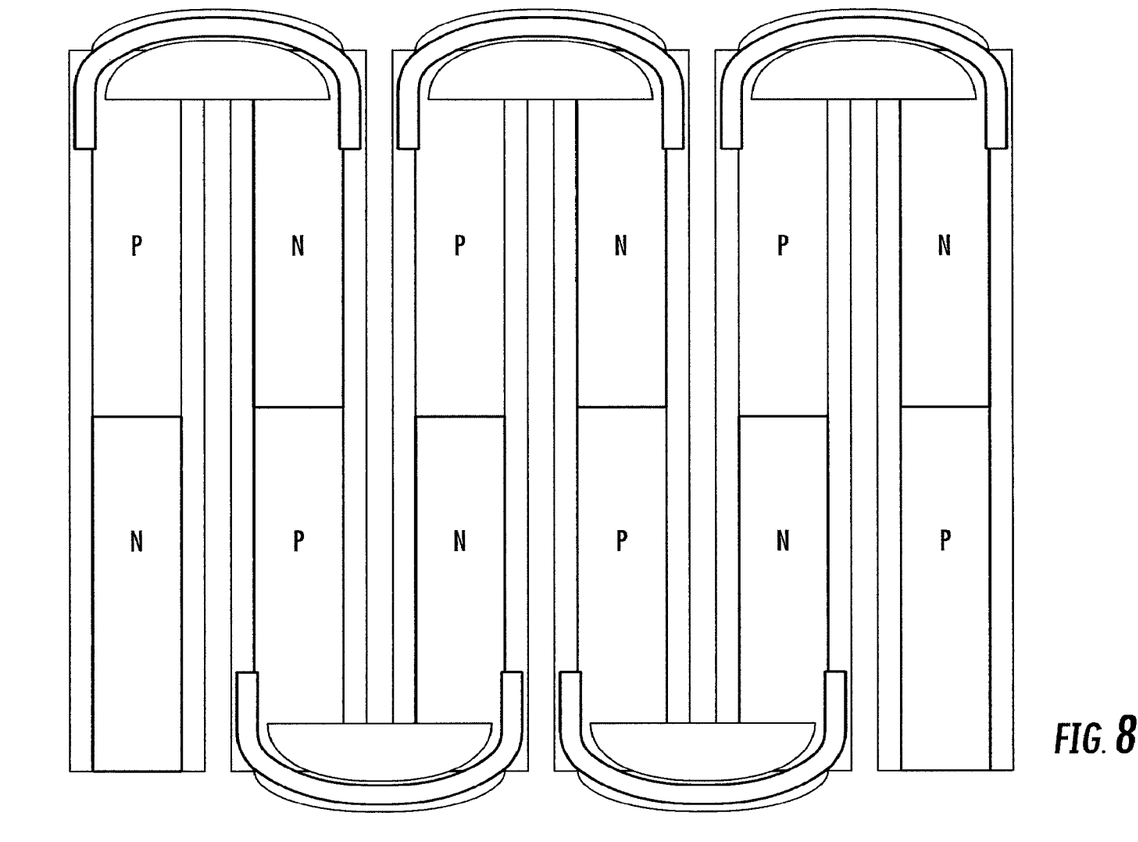
FIG. 8 illustrates the thin-film of FIG. 7 under full compression in the form of a voltage multiplier.

In another embodiment, the thin-film layer can be formed into a voltage multiplier. FIGS. 6 and 7 illustrate forming the thin-film layer into a voltage multiplier according to one embodiment described herein. As illustrated in FIG. 6, a thin-film having an architecture described in Section I hereinabove is fabricated and metal pads are added to form capacitor structures when the thin-film adopts a folded configuration. FIG. 7 illustrates the thin-film layer in the folded configuration. Insulating material is added to both sides of the thin-film for electrical isolation of opposing faces. When the folded thin-film is compressed, the metal pads align and form capacitors throughout the structure. The capacitors in combination with the diodes result in a voltage multiplier. FIG. 8 illustrates the construction of FIG. 7 in full compression to provide the voltage multiplier. A voltage multiplier formed from a thin-film of Section I above can have any desired thickness, generally depending on the desired output of the voltage multiplier.

Figure 9:
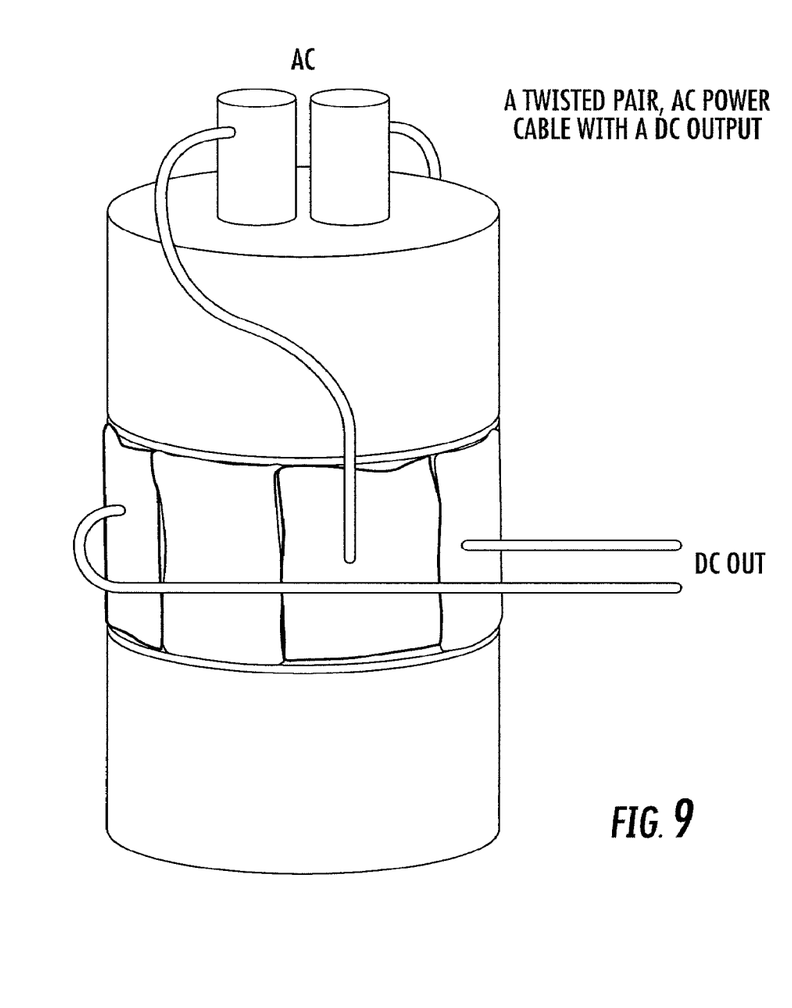
FIG. 9 illustrates bridge rectifier according to one embodiment described herein.

In alternative embodiments, thin-films described in Section I above are not folded. Instead, the thin-films can be bent or wrapped around a substrate when forming electrical circuits. FIG. 9 illustrates a bridge rectifier formed from a thin-film wrapped around a substrate according to one embodiment descried herein. The ability to conform to substrate surface geometry enables use of thin-films described herein in a variety of electrical circuit applications.

Figure 10:
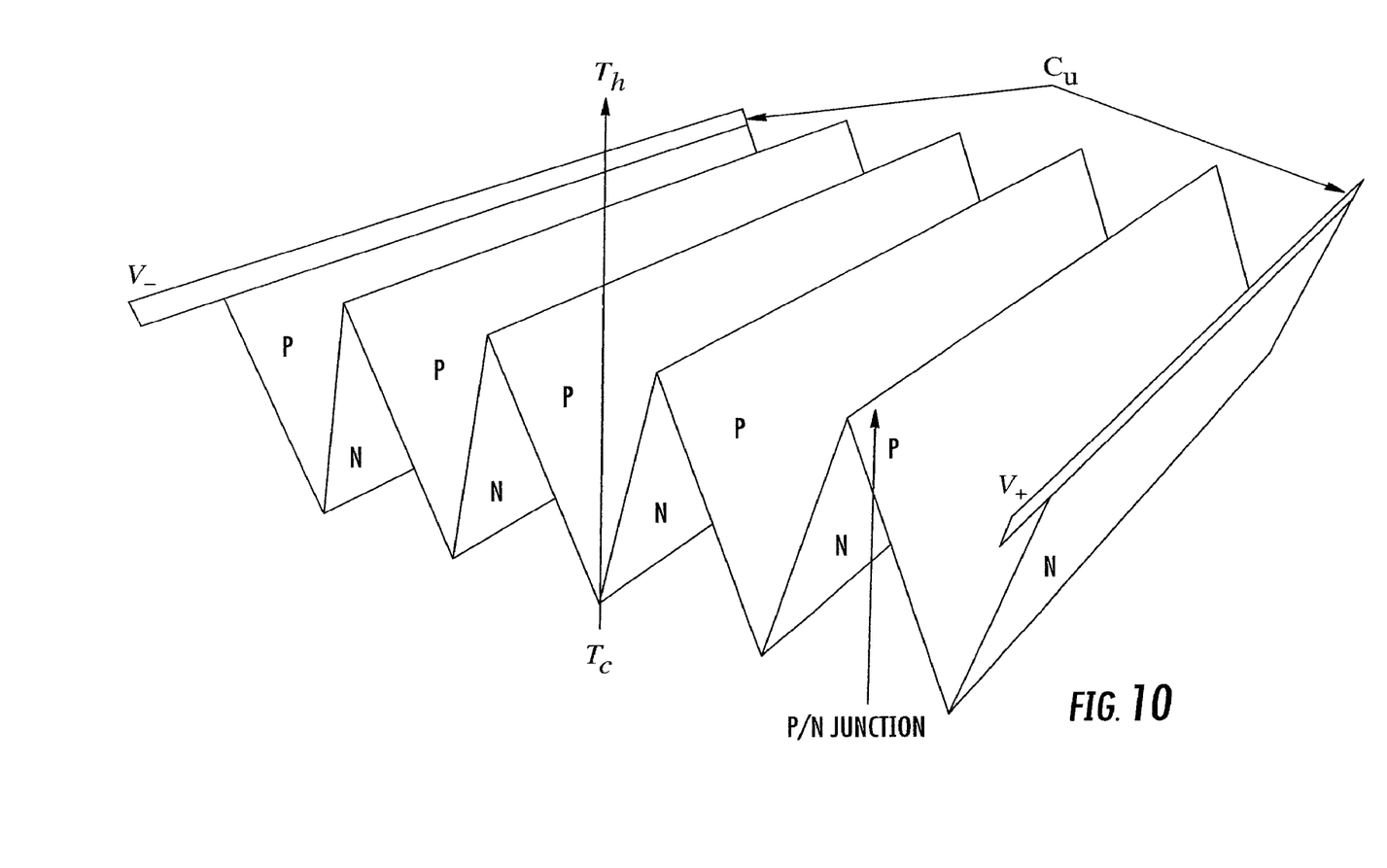
FIG. 10 is a schematic of a device for electrical energy production wherein a thin-film layer is folded along the p-n junctions into a corrugated architecture according to one embodiment described herein.

In another aspect, the thin-film described in Section I above can function in an electrical circuit as a component for electrical energy production. For example, the thin-film can be folded along the p-n junctions into a corrugated orientation. As illustrated in FIG. 10, providing a corrugated orientation can permit the thin-film layer to function as a thermoelectric device when the individual alternating p-type and n-type regions are constructed of thermoelectric materials as set forth in Section I above. For a given device, the terminating n-type and p-type segments are connected to a conductor such as copper extending along the width of the device to collect the thermoelectric potential ($V_+$, $V_-$). The thermoelectric potential can be connected to a load or to a storage device such as a battery or capacitor.

In some embodiments, electrically insulating material is introduced to electrically isolate p-type regions and n-type regions in the corrugated orientation. In some embodiments, an insulating layer comprises one or more polymeric materials. Any polymeric material not inconsistent with the objectives of the present invention can be used in the production of an insulating layer. A polymeric insulating layer can comprise semicrystalline polymer including, but not limited to, polyvinyl fluoride (PVF), polyvinylidene fluoride (PVDF), polyvinylidene fluoride-trifluoroethylene (PVDF-TrFE), polyvinylidene fluoride-tetrafluoroethylene (PVDF-TFE), polytetrafluoroethylene (PTFE) or mixtures or copolymers thereof. An insulating layer, in some embodiments, comprises polyacrylic acid (PAA), polymethacrylate (PMA), polymethylmethacrylate (PMMA) or mixtures or copolymers thereof. In some embodiments, an insulating layer comprises a polyolefin including, but not limited to polyethylene, polypropylene, polybutylene or mixtures or copolymers thereof.

A polymeric insulating layer can further comprise particles demonstrating piezoelectric behavior. For example, a polymeric insulating layer can comprise particles of $BaTiO_3$, BiTe particles, other inorganic piezoelectric particles or mixtures thereof. The $BaTiO_3$ particles, BiTe particles and/or other inorganic particles can have any size and/or geometry not inconsistent with the objectives of the present invention. $BaTiO_3$ and BiTe particles can demonstrate a size distribution ranging from 20 nm to 500 nm. Further, piezoelectric particles can be dispersed in polymer of the insulation layer at any loading not inconsistent with the objectives of the present invention. In some embodiments, $BaTiO_3$ particles, BiTe particles and/or other inorganic piezoelectric particles are nanoparticles are present in an insulating layer in an amount of 5-80 weight percent or 10-50 weight percent, based on the total weight of the insulating layer. As described herein, piezoelectric particles of an insulating layer can be electrically poled to further enhance the piezoelectric and/or pyroelectric properties of thermoelectric apparatus described herein.

Alternatively, an insulating layer can be formed of an inorganic or ceramic material. In some embodiments, an insulating layer is formed of metal oxide particles, including transition metal oxide particles. Suitable metal oxide particles can also demonstrate piezoelectric behavior. In one embodiment, for example, an insulating layer is formed of $BaTiO_3$ particles that can be electrically poled.

Further, the first and second organic carriers can be made sufficiently thick to serve as electrically insulating material between adjacent p-type and n-type regions in the corrugated orientation.

Figure 11:
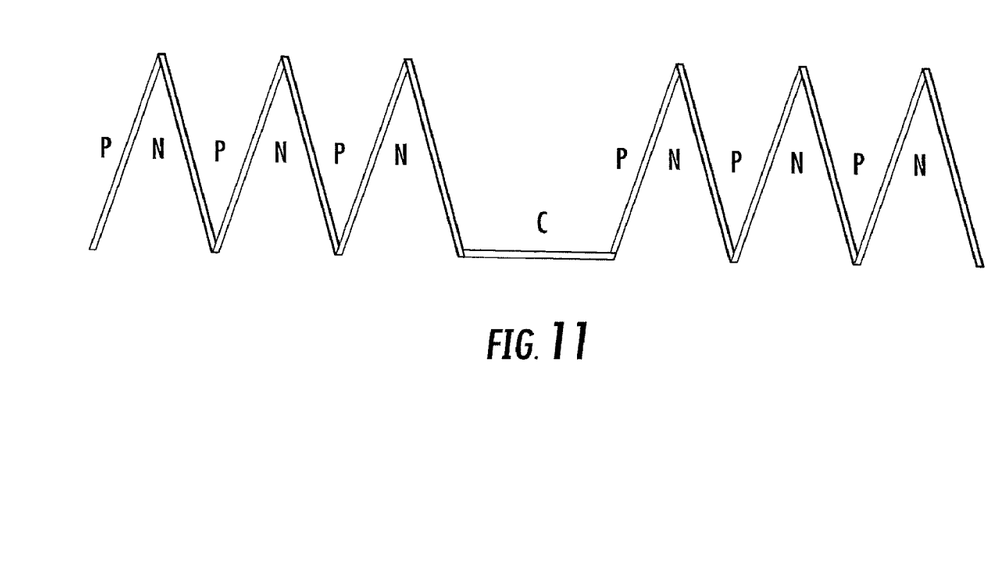
FIG. 11 is a schematic of corrugated thin-film thermoelectric devices described herein in electrical communication with a piezoelectric or solar element (c).

In some embodiments, devices employing thin-films described herein can be in electrical communication with one or more additional components for electrical energy production, including photovoltaics and/or piezoelectrics. FIG. 11 is a schematic of corrugated thin-film thermoelectric devices described herein in electrical communication with a piezoelectric or solar element (c). Voltage contributions from the thermoelectric devices and element (c) must be combined in such a way that they add to total device power output.

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the invention.

The invention claimed is:

1. A flexible composite material comprising:
   a flexible thin-film layer having a plurality of lateral surface p-n junctions across a face of the flexible thin-film layer, the lateral surface p-n junctions established at interfaces between p-type regions and n-type regions, the p-type regions comprising electrically conductive particles dispersed in a first organic carrier and the n-type regions comprising electrically conductive particles dispersed in a second organic carrier,
   wherein the flexible composite material is foldable.

2. The flexible composite material of claim 1, wherein the electrically conductive particles of the p-type regions comprise p-type organic nanoparticles, p-type inorganic nanoparticles or mixtures thereof.

3. The flexible composite material of claim 2, wherein the p-type organic nanoparticles and p-type inorganic nanoparticles are selected from the group consisting of nanotubes, nanowires, platelets and sheets.

4. The flexible composite material of claim 1, wherein the p-type regions and the n-type regions are arranged in an alternating one-dimensional array that is arranged in a folded configuration.

5. The flexible composite material of claim 1 wherein p-dopant is provided to the electrically conductive particles of the p-type region by the first organic carrier or p-dopant species in the first organic carrier.

6. The flexible composite material of claim 1, wherein the electrically conductive particles of the n-type regions comprise n-type organic nanoparticles, n-type inorganic nanoparticles or mixtures thereof.

7. The flexible composite material of claim 6, wherein the n-type organic nanoparticles and n-type inorganic nanoparticles are selected from the group consisting of nanotubes, nanowires, platelets and sheets.

8. The flexible composite material of claim 7, wherein the n-type organic nanoparticles and n-type inorganic nanoparticles are 1-dimensional or 2-dimensional.

9. The flexible composite material of claim 1, wherein n-dopant is provided to the electrically conductive particles of the n-type region by the first organic carrier or n-dopant species in the first organic carrier.

10. The flexible composite material of claim 1, wherein the first organic carrier comprises one or more polymeric species.

11. The flexible composite material of claim 10, wherein the first organic carrier comprises fluoropolymer.

12. The flexible composite material of claim 11, wherein the fluoropolymer comprises polyvinylfluoride, polyvinylidene fluoride, polyvinylidene fluoride-trifluoroethylene, polyvinylidene fluoride-tetrafluoroethylene or mixtures thereof.

13. The flexible composite material of claim 1, wherein the second organic carrier comprises one or more polymeric species.

14. The flexible composite material of claim 13, wherein the second organic carrier comprises fluoropolymer.

15. The flexible composite material of claim 14, wherein the fluoropolymer comprises polyvinylfluoride, polyvinylidene fluoride, polyvinylidene fluoride-trifluoroethylene, polyvinylidene fluoride-tetrafluoroethylene or mixtures thereof.

16. The flexible composite material of claim 1, wherein the interfaces are seamless.

17. The flexible composite material of claim 16, wherein the first organic carrier and the second organic carrier are formed of the same material.

18. The flexible composite material of claim 1, wherein seams are present at the interfaces.

19. The flexible composite material of claim 1, wherein the flexible thin-film layer has a thickness of 10 nm to 100 μm.

20. An electrical circuit comprising:
the flexible composite material of claim 1;
an insulating layer applied to the flexible thin film layer; and
electrical leads attached to one or more of the p-type regions and the n-type regions, wherein the flexible thin film has a folded orientation.

21. The electrical circuit of claim 20, wherein the electrically conductive particles of the p-type regions are selected from the group consisting of nanotubes, nanowires, platelets and sheets.

22. The electrical circuit of claim 20, wherein p-dopant is provided to the electrically conductive particles of the p-type region by the first organic carrier or p-dopant species in the first organic carrier.

23. The electrical circuit of claim 20, wherein the electrically conductive particles of the n-type regions are selected from the group consisting of nanotubes, nanowires, platelets and sheets.

24. The electrical circuit of claim 20, wherein n-dopant is provided to the electrically conductive particles of the n-type region by the second organic carrier or n-dopant species in the second organic carrier.

25. The electrical circuit of claim 20, wherein the insulating layer isolates opposing faces of the flexible thin-film layer.

* * * * *